United States Patent
Hwang et al.

(10) Patent No.: US 9,214,631 B2
(45) Date of Patent: Dec. 15, 2015

(54) RESISTIVE RAM, METHOD FOR FABRICATING THE SAME, AND METHOD FOR DRIVING THE SAME

(71) Applicants: SK hynix Inc., Gyeonggi-do (KR); Gwangju Institute of Science and Technology, Gwangju (KR)

(72) Inventors: Hyun-Sang Hwang, Gwangju (KR); Xinjun Liu, Gwangju (KR); Myoung-Woo Son, Gwangju (KR)

(73) Assignees: SK Hynix Inc., Gyeonggi-do (KR); Gwangju Institute of Science and Technology, Gwangju (KR)

( * ) Notice: Subject to any disclaimer, the term of this patent is extended or adjusted under 35 U.S.C. 154(b) by 0 days.

(21) Appl. No.: 14/799,955

(22) Filed: Jul. 15, 2015

(65) Prior Publication Data

US 2015/0318474 A1    Nov. 5, 2015

Related U.S. Application Data

(62) Division of application No. 13/554,635, filed on Jul. 20, 2012, now Pat. No. 9,117,513.

(30) Foreign Application Priority Data

Jul. 22, 2011    (KR) .................. 10-2011-0072869

(51) Int. Cl.
*G11C 11/00* (2006.01)
*H01L 45/00* (2006.01)

(52) U.S. Cl.
CPC ............ *H01L 45/1633* (2013.01); *H01L 45/08* (2013.01); *H01L 45/1233* (2013.01); *H01L 45/1253* (2013.01); *H01L 45/146* (2013.01)

(58) Field of Classification Search
CPC ....................................................... G11C 11/00
USPC ............ 365/46, 94, 100, 129, 148, 158, 163; 257/2–5, 9, 295, 310, E21.35; 438/95, 438/96, 135, 166, 240, 365, 482, 486, 597, 438/785
See application file for complete search history.

(56) References Cited

U.S. PATENT DOCUMENTS 8,466,461 B2 *    6/2013    Seo et al. .................. 257/43

* cited by examiner

*Primary Examiner* — Harry W Byrne
(74) *Attorney, Agent, or Firm* — IP & T Group LLP

(57) ABSTRACT

A resistive random access memory (ReRAM) includes a first electrode, a threshold switching layer formed over the first electrode and configured to perform a switching operation according to an applied voltage, a resistance change layer formed over the threshold switching layer, and configured to perform a resistance change operation, and a second electrode formed over the resistance change layer, wherein the threshold switching layer comprises a stoichiometric transition oxide while the resistance change layer comprises a non-stoichiometric transition metal oxide.

9 Claims, 16 Drawing Sheets

PATH 7) HRS/ON

PATH 8) HRS/OFF

<ONLY RESISTANCE CHANGE LAYER USED>

<RESISTANCE CHANGE LAYER AND THRESHOLD SWITCHING LAYER USED>

<CHARACTERISTIC OF RESISTANCE CHANGE LAYER>

<CHARACTERISTIC OF THRESHOLD SWITCHING LAYER>

<CHARACTERISTIC OF RESISTANCE CHANGE LAYER>

<CHARACTERISTIC OF THRESHOLD SWITCHING LAYER>

PATH 1) HRS/OFF

PATH 2) HRS/ON

PATH 3) LRS/ON

PATH 4) LRS/OFF

PATH 5) LRS/OFF

PATH 6) LRS/ON

PATH 7) HRS/ON

PATH 8) HRS/OFF

RESISTIVE RAM, METHOD FOR FABRICATING THE SAME, AND METHOD FOR DRIVING THE SAME

CROSS-REFERENCE TO RELATED APPLICATIONS

This application is a division of U.S. patent application Ser. No. 13/554,635 filed on Jul. 20, 2012, which claims priority of Korean Patent Application No. 10-2011-0072869, filed on Jul. 22, 2011. The disclosure of each of the foregoing application is incorporated herein by reference in its entirety.

BACKGROUND

1. Field

Exemplary embodiments of the present invention relate to a nonvolatile memory device, a method for fabricating the same, and a method for driving the same, and more particularly, to a resistive random access memory (ReRAM) having a threshold switch element provided in a bidirectional resistance change layer, a method for fabricating the same, and a method for driving the same.

2. Description of the Related Art

Existing nonvolatile memory devices are represented by a flash memory. Recently, research has been actively conducted on next-generation memories having new materials and structures, in order to replace the existing nonvolatile memory devices. As one of the next-generation memories, a resistive random access memory (ReRAM) may have features of a low production cost, a simple fabrication process, low power consumption, and a high read/write speed. Accordingly, much attention has been paid to the ReRAM. Furthermore, since the ReRAM may employ a cross-point structure, the ReRAM may satisfy the recent demand for a high-capacity memory device. In the cross-point structure, however, a leakage current may flow through adjacent cells. In order to solve the concerns, research is being conducted on a method for connecting a switch element such as a transistor or diode to ReRAM.

For example, in the cross-point structure, a changeable resistance material is deposited at an intersection between a word line and a bit line and connected to a transistor or diode. However, when the transistor is applied to ReRAM, the size of the ReRAM increases. The diode may not be applied to ReRAM using a bipolar voltage. Therefore, it may be difficult to maximize the features of the ReRAM.

Recently, a nonvolatile memory device including a resistor having a threshold switch characteristic and a memory array including the same (U.S. Pat. No. 7,935,952) have been disclosed, in order to solve a leakage current problem in the ReRAM and enhance the advantage of the ReRAM.

In the above-described patent document, a threshold switching layer having a threshold switch characteristic and a resistance change layer are connected in series. The above-described patent document discloses a graph showing that the threshold switching layer is connected in series to a unipolar memory where a set operation or a reset operation occurs in one voltage state.

FIGS. 1A and 1B are current-voltage graphs illustrating electrical characteristics of the resistance change layer and the threshold switching layer in the conventional nonvolatile memory device.

Referring to FIG. 1A, the resistance change layer has a high resistance state (HRS) or a low resistance state (LRS) when a voltage is not applied. An operation for changing resistance state of the resistance change layer from the HRS to the LRS is referred to as a set operation. A voltage to cause the set operation is referred to as a set voltage Vset. On the other hand, an operation for changing resistance state of the resistance change layer from the LRS to the HRS is referred to as a reset operation. A voltage to cause the reset operation is referred to as a reset voltage Vreset. In the resistance change layer having a bidirectional characteristic, the set operation and the reset operation occur at different voltage polarities. For example, in FIGS. 1A and 1B, a positive voltage difference cause the set operation; and a negative voltage difference causes the reset operation.

Referring to FIG. 1B, the threshold switching layer can be in a low resistance state Rmetal, which is similar to that of a metal, or a high resistance state Rinsulator which is similar to that of a nonconductor. The threshold switching layer may have different characteristic curve from the resistance change layer because the threshold switching layer has the characteristic of a nonconductor in a state where a voltage is not applied. Furthermore, when a given voltage is applied to the threshold switching layer, an amount of currents rapidly increases and a resistance rapidly decreases. At this time, the applied voltage is referred to as a threshold voltage Vth. On the other hand, when the voltage level applied to the threshold switching layer decreases, an amount of currents rapidly decreases and a resistance rapidly increases. At this time, the voltage is referred to as a sustain voltage Vh. Furthermore, the threshold switching layer has a symmetrical electrical characteristic depending on the polarity of a voltage applied across the threshold switching layer. Therefore, threshold voltages Vth+ and Vth− based on an applied voltage difference have the same magnitude. Sustain voltages Vh+ and Vh− also have the same magnitude.

FIG. 2 is a conceptual diagram for explaining a read operation of the conventional ReRAM.

Referring to FIG. 2, the ReRAM includes a plurality of word lines and a plurality of bit lines. A plurality of memory cells are arranged at the respective intersections between the word lines and the bit lines. Each of the memory cells has a resistance change layer and a threshold switching layer.

In order to perform a read operation, a specific voltage level is applied to sense a difference between resistive states of the resistance change layer. In order to perform a read operation on a unit cell in the ReRAM array having a cross-point structure, a voltage of −Vread/2 is applied to a bit line, and a voltage of Vread/2 is applied to a word line. Therefore, a voltage difference of Vread for a read operation is applied between the bit line and the word line coupled to a selected cell. In this case, however, a voltage difference of Vread/2 is applied between the bit line and the word line coupled to an unselected cell.

FIGS. 3A and 3B are graphs illustrating the resistance states of the conventional ReRAM.

FIG. 3A illustrates resistive states of selected unselected cells, during a read operation, which includes a resistance change layer and a threshold switching layer. When only the resistance change layer is included and the threshold switching layer is not embedded, a voltage of Vread/2 is applied to both the selected cell and the unselected cell adjacent to the selected cell. When the unselected cell is in the LRS during the read operation, a current path may be formed because of the voltage of Vread/2. Therefore, when the size of the cell in the cross-point structure increases, the amount of current flown with respect to the applied voltage of Vread/2 increases. In this case, it may be impossible to correctly recognize the amount of current flowing in the selected cell.

Referring to FIG. 3B, when the threshold switching layer is embedded, a current flow may not be formed because of the HRS maintained when a voltage is not applied. Accordingly, it is possible to discriminate the selected cell from the unselected cell during the read operation. A method for minimizing an error during the read operation has been researched to limit the amount of current flowing through the unselected cell by the threshold switching layer.

However, the above-described conventional ReRAM has a sequentially stacked structure of the threshold switching layer and the resistance change layer. In particular, when different layers are deposited at a high temperature, an unexpected characteristic change may occur at the interface or contact area between the different layers. Furthermore, if defects are concentrated on the interface or the contact area, it may be difficult to practically implement a semiconductor memory device, such as ReRAM, based on a theoretical current-voltage characteristic.

SUMMARY

An exemplary embodiment of the present invention is directed to a resistive random access memory (ReRAM) including a resistance change layer and a threshold switching layer having different characteristics are formed at the same time through one process, without using a sequential stacking process.

Another exemplary embodiment of the present invention is directed to a method for fabricating a ReRAM.

Another exemplary embodiment of the present invention is directed to a method for driving a ReRAM.

In accordance with an exemplary embodiment of the present invention, a ReRAM includes a first electrode, a threshold switching layer formed over the first electrode and configured to perform a switching operation according to an applied voltage, a resistance change layer formed over the threshold switching layer, and configured to perform a resistance change operation, and a second electrode formed over the resistance change layer, wherein the threshold switching layer comprises a stoichiometric transition oxide, while the resistance change layer comprises a non-stoichiometric transition metal oxide.

In accordance with another exemplary embodiment of the present invention, a method for fabricating a ReRAM includes forming a non-stoichiometric phase change layer over a first electrode, forming a second electrode over the phase change layer, and applying a voltage to the first and second electrodes, modifying the phase change layer into a threshold switching layer for a switching operation, and oxidizing a part of the second electrode to form a resistance change layer.

In accordance with yet another exemplary embodiment of the present invention, there is provided a method for driving a ReRAM which includes a first electrode, a threshold switching layer of stoichiometric transition oxide formed over the first electrode, a resistance change layer of a non-stoichiometric transition metal oxide formed over the threshold switching layer, and a second electrode formed over the resistance change layer. The method includes applying a first voltage to turn on the threshold switching layer and to change the resistance change layer from a high resistance state to a low resistance state; turning off the threshold switching layer by reducing the first voltage; applying a second voltage having an opposite polarity of the first voltage to turn on the threshold switching layer and to change the resistance change layer from a low resistance state to a high resistance state; and turning off the threshold switching layer by reducing the second voltage.

DETAILED DESCRIPTION

Figure 1A:
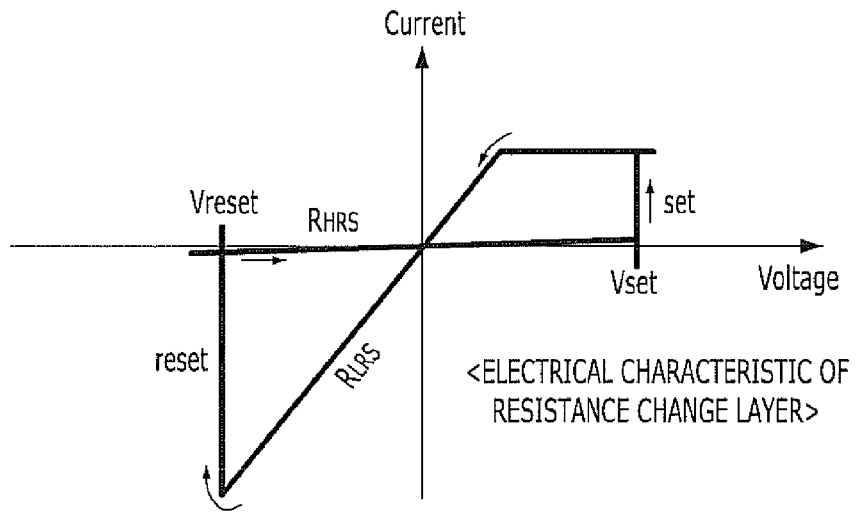
FIGS. 1A and 1B are current-voltage graphs illustrating electrical characteristics of a resistance change layer and a threshold switching layer in a conventional nonvolatile memory device.
Figure 1B:
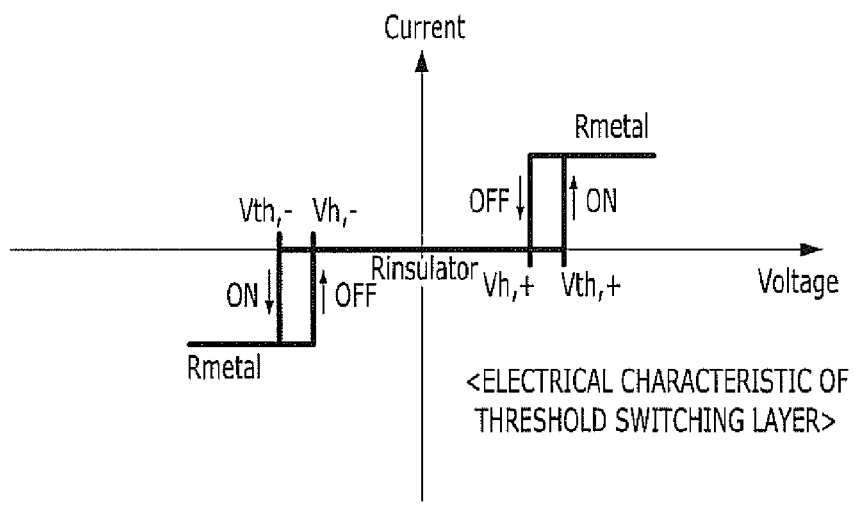
Figure 2:
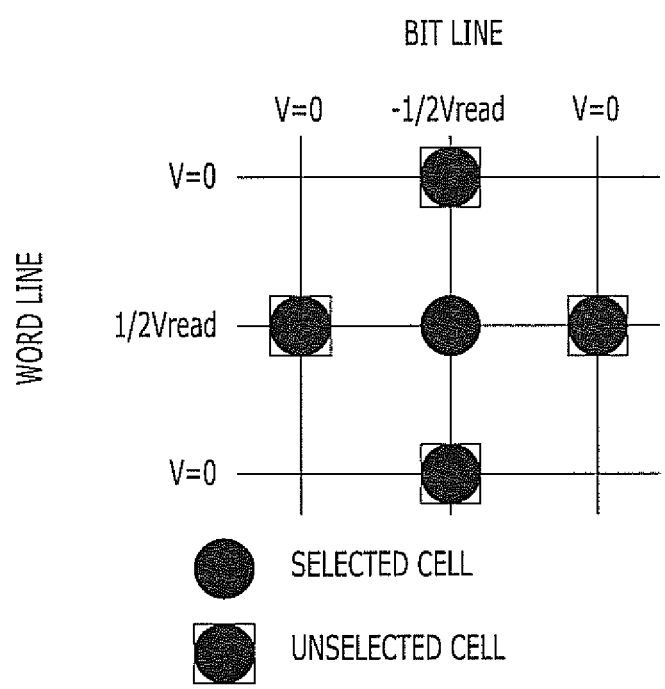
FIG. 2 is a conceptual diagram for explaining a read operation of the conventional ReRAM.
Figure 3A:
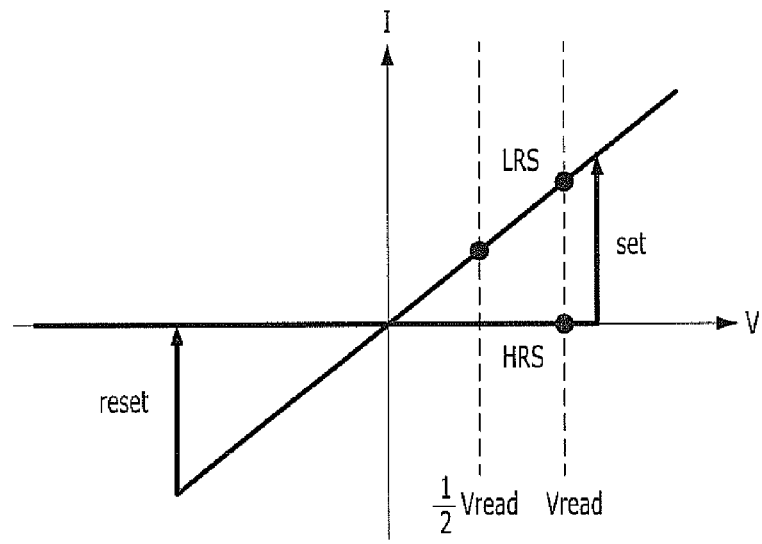
FIGS. 3A and 3B are graphs illustrating resistive states of the conventional ReRAM.
Figure 3B:
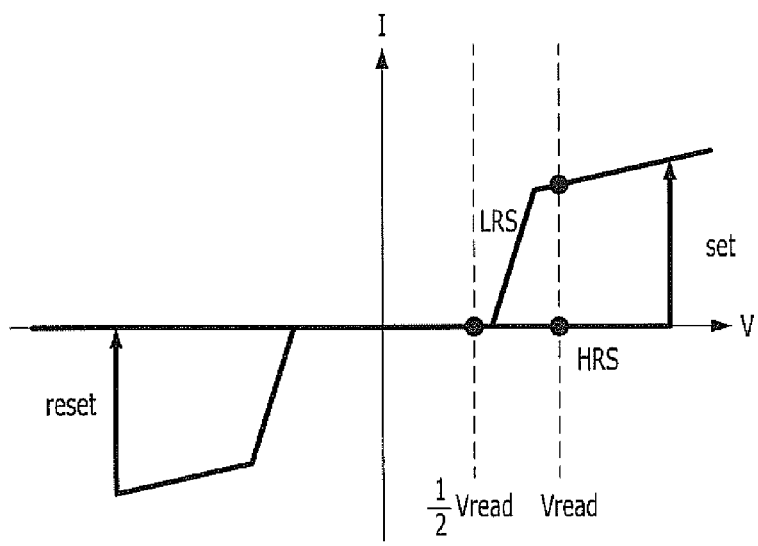

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 4:
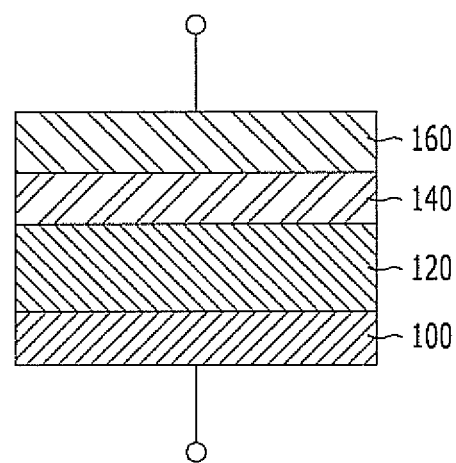
FIG. 4 is a cross-sectional view of a ReRAM in accordance with an exemplary embodiment of the present invention.

FIG. 4 is a cross-sectional view of a ReRAM in accordance with an exemplary embodiment of the present invention.

Referring to FIG. 4, the ReRAM in accordance with the exemplary embodiment of the present invention includes a lower electrode 100, a threshold switching layer 120, a resistance change layer 140, and an upper electrode 160.

The threshold switching layer 120 may have a stoichiometric composition. Furthermore, the threshold switching layer 120 has the characteristic of a conductor or nonconductor based on a threshold voltage. For example, when a voltage corresponding to the threshold voltage or more is applied, the threshold switching layer 120 may be turned on to have a low resistance such as the characteristic of conductors. Furthermore, when a voltage corresponding to less than the threshold voltage is applied, the threshold switching layer 120 has a high resistance value such as the characteristic of nonconductors. Therefore, the threshold switching layer 120 is turned on or off according to a voltage applied between both electrodes.

For example, the threshold switching layer 120 may have a composition of niobium oxide ($NbO_2$) or vanadium oxide ($VO_2$). In particular, the threshold switching layer 120 has a changeable resistive state from an initial non-stoichiometric composition to a stoichiometric composition according to transition of oxygen. Herein, the stoichiometric composition may describe compound's state based on the quantitative relationships among elements in the compound, while the non-stoichiometric composition may show compound's state not represented by a ratio of well-defined natural numbers. For example, the threshold switching layer 120 may be formed to have a stoichiometric composition modified from a non-stoichiometric composition by oxygen departure. Furthermore, the resistance change layer 140 includes a non-stoichiometric transition metal oxide which exists in a state where the upper electrode is oxidized by transfer of oxygen atoms from the threshold switching layer 120. Preferably, the resistance change layer 140 may include an oxide of the material forming the upper electrode 160, that is, a metal oxide. Furthermore, the resistance change layer 140 may become a high resistance state (LRS) or a high resistance state (HRS) determined by formation and removal of a conductive filament, caused by oxygen transfer.

Figure 5A:
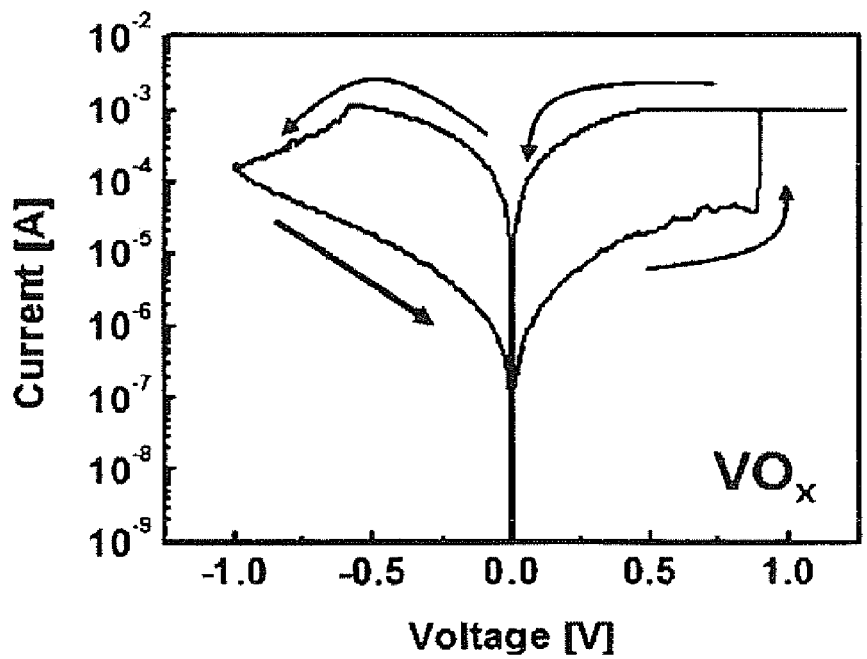
FIGS. 5A and 5B are graphs illustrating electrical characteristics of a resistance change layer and a threshold switching layer including vanadium oxide in accordance with another exemplary embodiment of the present invention.
Figure 5B:
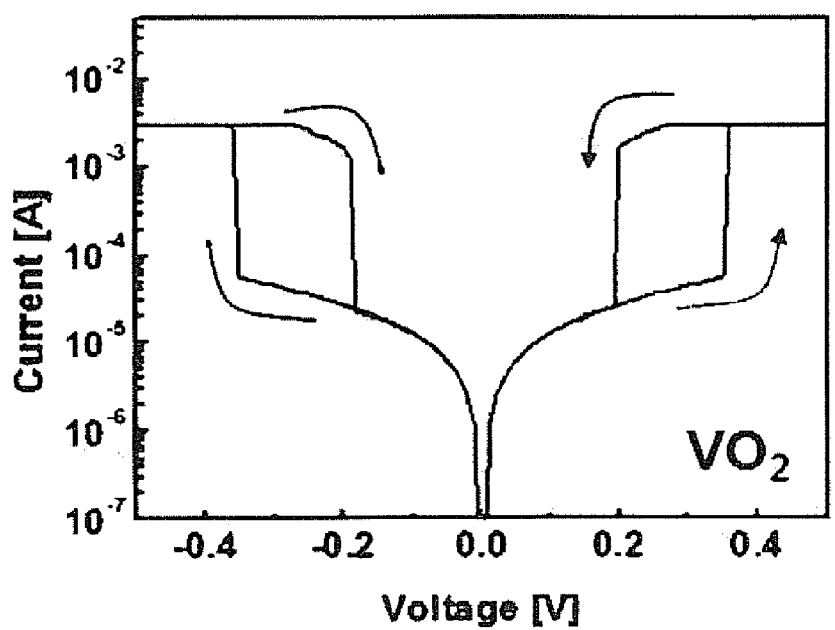

FIGS. 5A and 5B are graphs illustrating characteristics of the resistance change layer and the threshold switching layer formed of vanadium oxide in accordance with the exemplary embodiment of the present invention.

Referring to FIGS. 5A and 5B, the vanadium oxide has a phase based on a stoichiometric composition of VO, $V_2O_3$, $VO_2$, or $V_2O_5$ and a phase based on a non-stoichiometric composition of $VO_{2-x}$ (0<x<1) or $V_2O_{5-x}$ (0<x<1), depending on the composition of oxygen. Therefore, the vanadium oxide may have different characteristics of the resistance change layer and the threshold switching layer, depending on the changeable composition of oxygen.

For example, referring to FIG. 5A, the non-stoichiometric vanadium oxide ($VO_x$) has oxygen vacancies which may be moved depending on an applied voltage. The oxygen vacancies may form a conductive filament or remove a formed conductive filament, while moving in layers according to the polarity of the voltage. That is, the non-stoichiometric vanadium oxide ($VO_x$) has a characteristic of a filament-type resistance change layer which is applicable to a set operation and a reset operation.

Furthermore, referring to FIG. 5B, $VO_2$ among the stoichiometric oxides has a metal-insulator transistor (MIT) characteristic in which it transits from a conductor to a nonconductor at a critical temperature of about 68° C. For example, the crystal structure of $VO_2$ at the critical temperature or less is a monoclinic like the characteristic of a nonconductor. On the other hand, when the internal temperature of $VO_2$ exceeds the critical temperature due to application of heat energy, $VO_2$ has a tetragonal structure exhibiting the characteristic of a metal. Therefore, the vanadium oxide may be used as the resistance change layer or the threshold switching layer through the control of the oxygen composition.

Figure 6A:
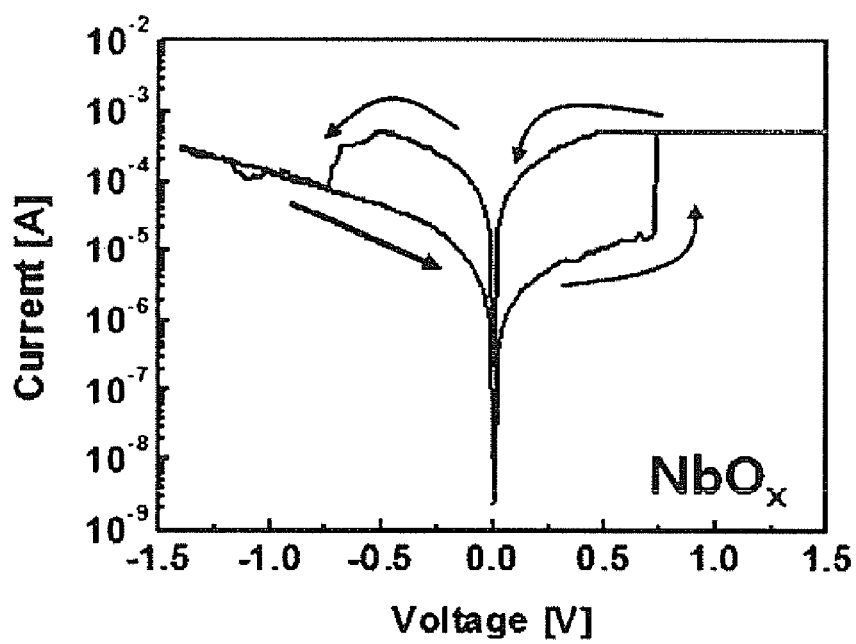
FIGS. 6A and 6B are graphs illustrating electrical characteristics of the resistance change layer and the threshold switching layer including niobium oxide in accordance with another exemplary embodiment of the present invention.
Figure 6B:
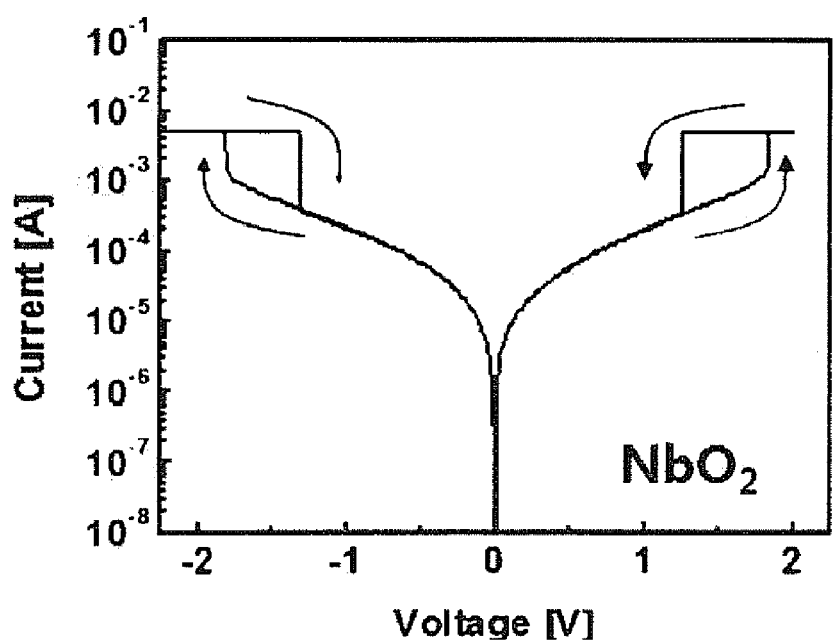

FIGS. 6A and 6B are graphs illustrating characteristics of the resistance change layer and the threshold switching layer formed of niobium oxide in accordance with the exemplary embodiment of the present invention.

Referring to FIGS. 6A and 6B, the niobium oxide has a stoichiometric phase of NbO, $Nb_2O_3$, $NbO_2$, or $Nb_2O_5$ or a non-stoichiometric phase of $NbO_{2-x}$ (0<x<1) or $Nb_2O_{5-x}$ (0<x<1), depending on the deposition of oxygen.

Referring to FIG. 6A, the non-stoichiometric niobium oxide ($NbO_x$) has oxygen vacancies which may be moved according to an applied voltage. The oxygen vacancies may form or remove a filament to perform a set operation or reset operation.

Referring to FIG. 6B, $NbO_2$ among the stoichiometric niobium oxides has an MIT characteristic in which it transits from a nonconductor to a conductor at a critical temperature of 800° C. For example, the crystal structure of $NbO_2$ at the critical temperature or less has a rutile structure exhibiting the characteristic of a conductor. However, when the internal temperature of $NbO_2$ exceeds the critical temperature due to application of heat energy, the crystal structure of $NbO_2$ changes to a tetragonal structure exhibiting the characteristic of a conductor. This means that the stoichiometric niobium oxide may be used as the threshold switching layer.

Therefore, the vanadium oxide and the niobium oxide, which have the characteristics of the resistance change layer and the threshold switching layer, may facilitate the fabrication process of the ReRAM. Furthermore, in addition to the vanadium oxide and the niobium oxide, oxides of transition metals such as Ti, Fe, and Ni may have the characteristics of the resistance change layer and the threshold switching layer, and the ReRAM may be fabricated using the oxides.

FIGS. 7A to 7D are cross-sectional views for explaining a method for fabricating a ReRAM in accordance with another embodiment of the present invention.

Figure 7A:
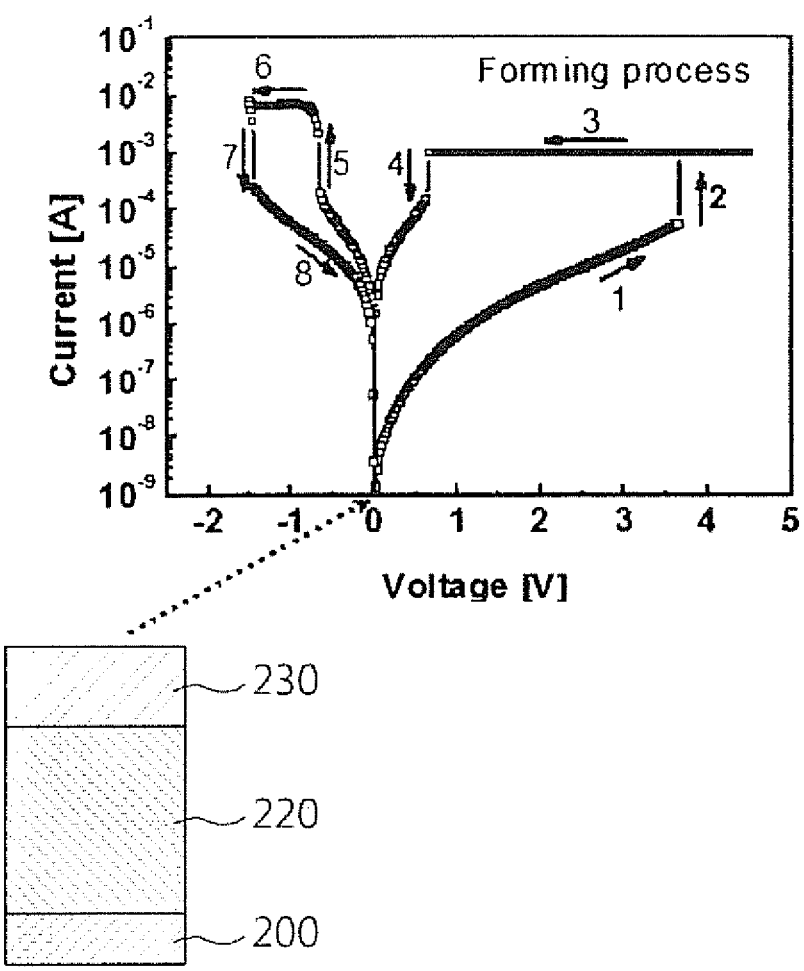
FIGS. 7A to 7D are cross-sectional views and graphs for explaining a method for fabricating a ReRAM in accordance with another exemplary embodiment of the present invention.

Referring to FIG. 7A, first, a phase change layer 220 is formed over a lower electrode 200. The phase change layer 220 has a composition of $Nb_2O_5$ (0<x<1) or $V_2O_{5-x}$ (0<x<1). That is, the phase change layer 220 has a stoichiometric composition. Furthermore, an upper electrode 230 is formed over the phase change layer 220. In this embodiment of the present invention, the lower electrode 200 is formed of platinum (Pt), and the upper electrode 230 is formed of tungsten (W). However, the electrodes may be formed of any materials, as long as they have a conductive characteristic. In particular, the upper electrode 230 may be formed of a transition metal which may form a metal oxide layer through transfer of oxygen within the phase change layer 220 and perform a function of the resistance change layer. Preferably, the upper electrode 230 may include a metal layer of any one selected from a group consisting of aluminum (Al), platinum (Pt), ruthenium (Ru), iridium (Ir), nickel (Ni), titanium (Ti), titanium nitride (Tin), tantalum (Ta), cobalt (Co), chromium (Cr), tungsten (W), copper (Cu), zirconium (Zr), and hafnium (Hf), or an alloy layer thereof.

Furthermore, the phase change layer 220 may be formed by various methods such as chemical vapor deposition (CVD), physical vapor deposition (PVD), and atomic layer deposition (ALD).

Figure 7B:
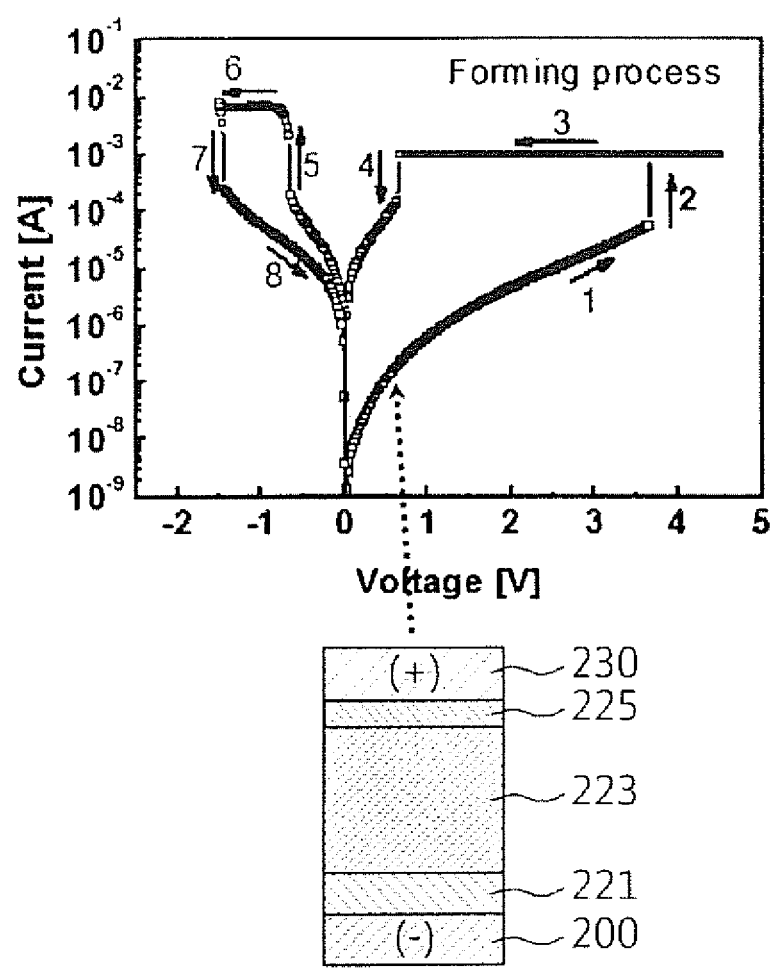

Referring to FIG. 7B, a positive voltage is applied to the upper electrode 230, and a negative voltage is applied to the lower electrode 200. Then, a voltage difference between both electrodes gradually increases. With the increase of the voltage difference, oxygen ions included in the phase change layer 220 are moved, and a first stoichiometric layer 221 is formed adjacent to the lower electrode 200. Therefore, a threshold switching layer starts to be gradually formed through the first stoichiometric layer 221. Furthermore, a second stoichiometric layer 223 may be formed over the first stoichiometric layer 221 by the motion of oxygen ions. In particular, the first stoichiometric layer 221 serves as the threshold switching layer 120 of FIG. 4. In FIG. 4, the second stoichiometric layer 223 is omitted. However, the second stoichiometric layer 223 may be selectively formed during the fabrication process.

The oxygen ions are continuously moved to the upper electrode 230 by an electric field applied between both electrodes. Therefore, the surface of the upper electrode 230 is oxidized to form a non-stoichiometric resistance change layer 225. That is, the resistance change layer 225 may be formed by oxidizing a part of the upper electrode 230 formed of a transition metal. Preferably, the resistance change layer 225 may include NiO, $TiO_2$, HfO, $Nb_2O_5$, ZnO, $ZrO_2$, $WO_3$, or CoO, as a transition metal oxide.

Figure 7C:
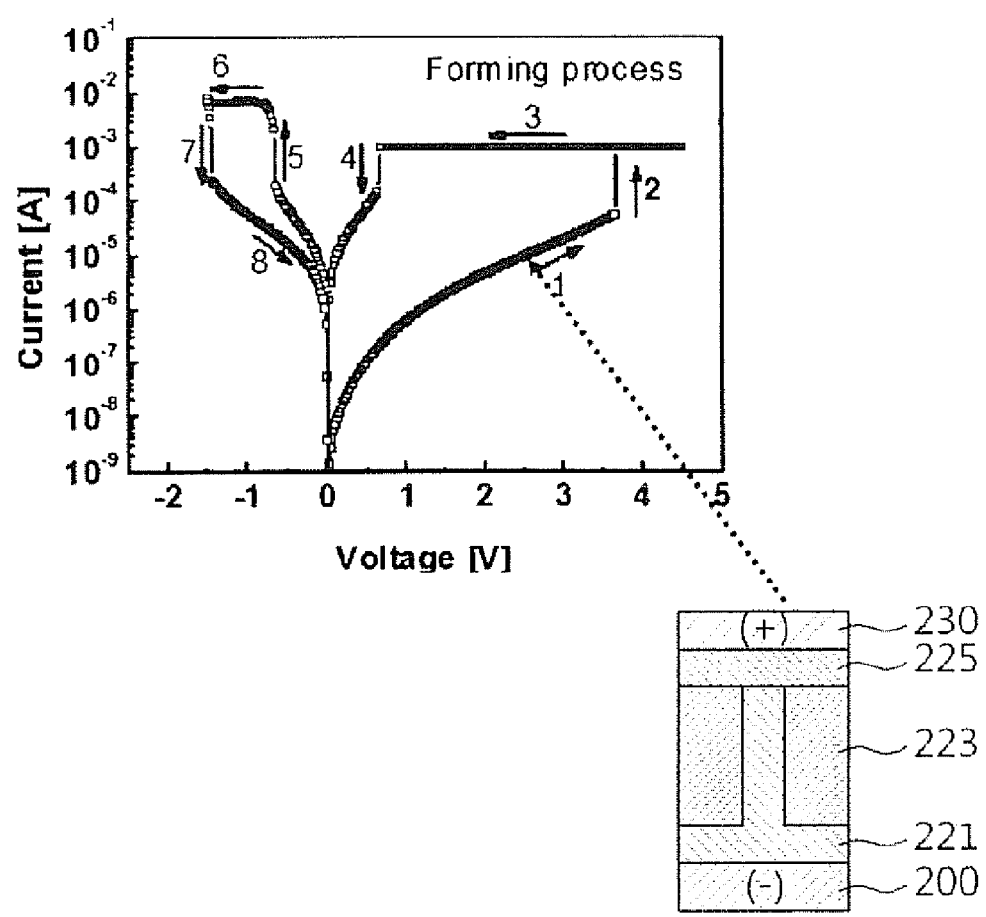

Referring to FIG. 7C, when a voltage applied between both electrodes continuously increases, the first stoichiometric layer 221 is grown and contacted with the resistance change layer 225. That is, the threshold switching layer is contacted with the resistance change layer 225.

When the applied voltage is continuously increased to apply a specific voltage difference between a word line and a bit line, the first stoichiometric layer 221 characteristically transits from a nonconductor to a conductor due to the increase of internal temperature. This is the same as described with reference to FIGS. 5A to 6B. Through this process, the threshold switching layer is formed.

For example, the lower electrode 200 is formed of Pt, the phase change layer 220 includes $Nb_2O_{5-x}$, and the upper electrode 230 includes tungsten (W). The thickness of the phase change layer 220 may be set to 20 nm.

Figure 7D:
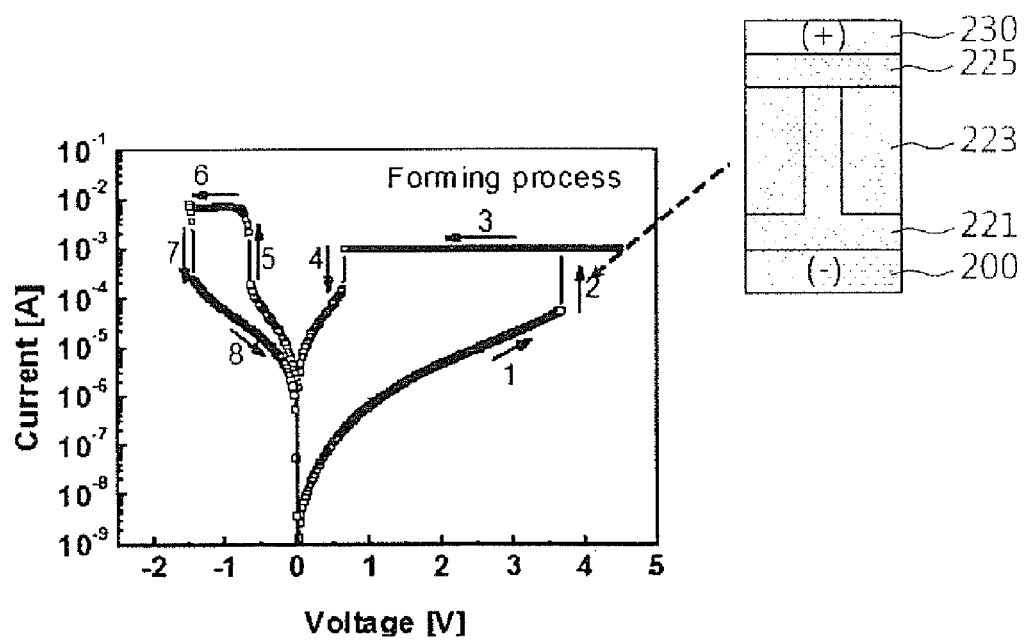

As described above, when the voltage is applied in a state where the upper electrode 230 and the lower electrode 200 are set to an anode and a cathode, respectively, oxygen ions are moved through oxygen vacancies existing in $Nb_2O_{5-x}$. As the oxygen ions are moved to the anode, $NbO_2$ is formed in the lowermost layer adjacent to the lower electrode 200 by the motion of the oxygen ions. Furthermore, $Nb_2O_5$ is formed over $NbO_2$ by the motion of the oxygen ions. Furthermore, the upper electrode 230 is oxidized by the oxygen ions, thereby forming a stoichiometric tungsten oxide. When the voltage is continuously applied, $NbO_2$ is grown and contacted with the tungsten oxide forming the resistance change layer 225. The growth of $NbO_2$ may have various conditions. FIG. 7D illustrates that $NbO_2$ is formed through $Nb_2O_5$, but $NbO_2$ may be grown in a state where the formation of $Nb_2O_5$ is omitted. Furthermore, the phase change layer 220 may be modified in various manners.

That is, the first stoichiometric layer 221, that is, $NbO_2$ and the second stoichiometric layer 223, that is, $Nb_2O_5$ are formed by the initially applied voltage. However, the first stoichiometric layer 221 may include a non-stoichiometric element. The second stoichiometric layer 223 may also include a non-stoichiometric element. However, the main material composition of the stoichiometric layers 221 and 223 is a stoichiometric material. Therefore, it can be seen that $Nb_2O_{5-x}$ may remain in $NbO_2$.

Furthermore, the more growth of $NbO_2$, the more thickness of the tungsten oxide forming the resistance change layer 225. This means that the motion of oxygen ions continuously occurs, and the oxidation of the upper electrode 230 further develops.

When a voltage difference of about 2V or more is applied, the characteristic of $NbO_2$ is modified into the characteristic of a conductor due to the heat energy. As $NbO_2$ is modified into a conductor, the voltage may be applied to a resistor, and then a conductive filament may be formed in the resistance change layer. When a voltage difference of about 4V is applied, a conductive filament is formed to rapidly increase the current amount in the memory. Through such a forming process, the conductive filaments of the threshold switching layer and the resistance change layer are completely formed.

The above-described forming process for forming the threshold switching layer may also be applied the same to the vanadium oxide. Therefore, the first stoichiometric layer 221 may include $VO_2$, and the second stoichiometric layer 223 may include $V_2O_5$. Furthermore, the initial phase change layer 220 may correspond to $V_2O_{5-x}$.

Figure 8:
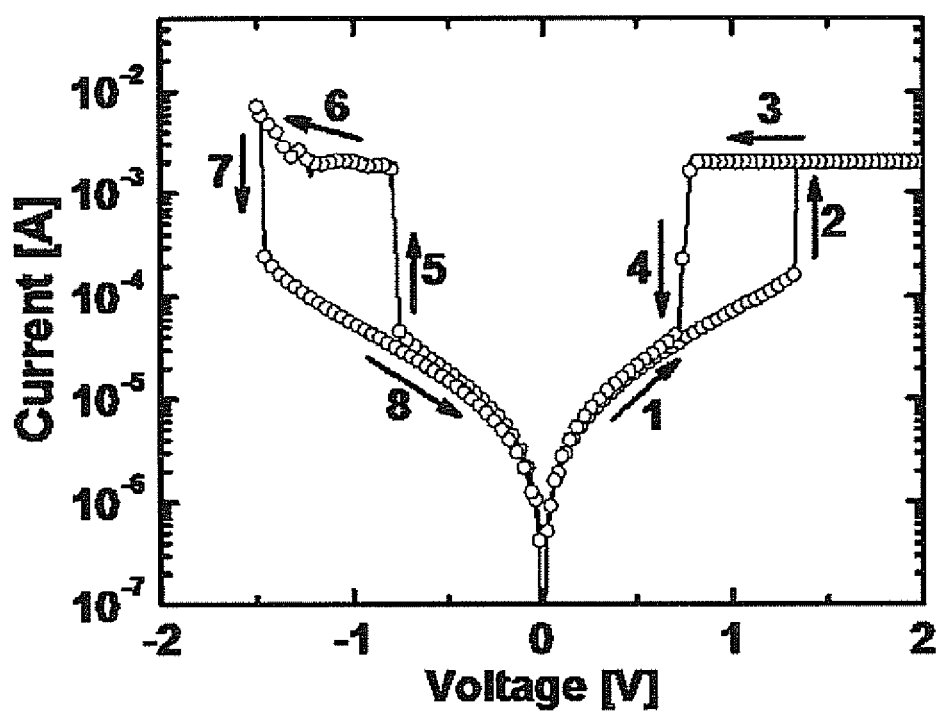
FIG. 8 is a graph illustrating the operation characteristic of the ReRAM in accordance with the exemplary embodiment of the present invention.

FIG. 8 is a graph illustrating the operation characteristic of the ReRAM in accordance with the embodiment of the present invention. FIGS. 9A to 9H are cross-sectional views illustrating the operation state of the ReRAM of FIG. 8.

Figure 9A:
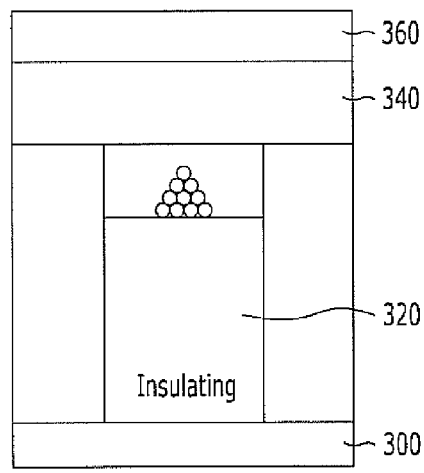
FIGS. 9A to 9H are cross-sectional views illustrating an operation of the ReRAM of FIG. 8.

Referring to FIG. 8 and FIG. 9A, the operation characteristic of the memory structure illustrated in FIG. 7C will be described. Therefore, the ReRAM is in a state where the forming process of FIG. 7C is completed. Therefore, a tungsten oxide is used as the resistance change layer, and $NbO_2$ is used as the threshold switching layer 320. Furthermore, a voltage is applied in a state where the upper electrode 360 is set to an anode and the lower electrode 300 is set to a cathode.

The voltage is applied to follow a path 1. At this time, since the resistance change layer 340 is in a state where a conductive filament is not formed, the resistance change layer 340 maintains the HRS. Furthermore, the threshold switching layer 320 is turned off. Therefore, a current is not applied to the resistance change layer 340.

Figure 9B:
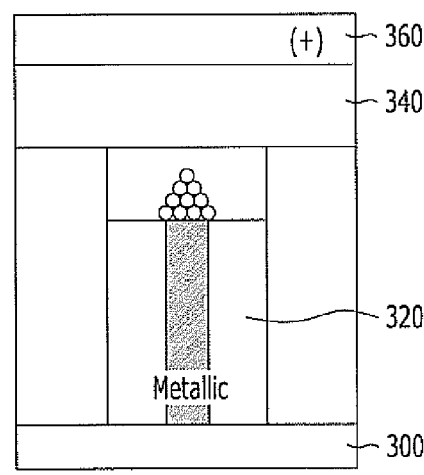

Referring to FIGS. 8 and 9B, the voltage is continuously increased to follow a path 2. The path 2 indicates that a voltage corresponding to the threshold voltage or more is applied. At the threshold voltage, the threshold switching layer 320 starts to gradually exhibit a conductive characteristic. Therefore, the threshold switching layer 320 is turned on to apply a current to the resistance change layer 340 through an electrode. Therefore, a conductive filament starts to be formed in the resistance change layer 340.

Figure 9C:
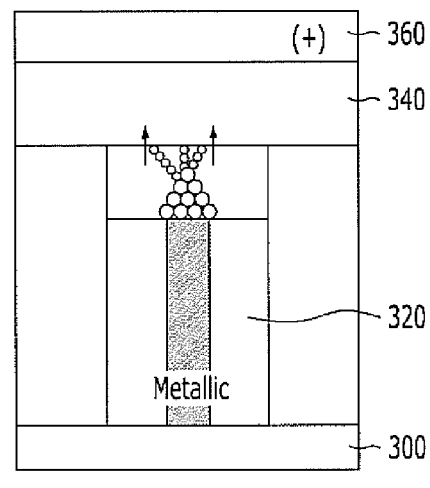

Referring to FIGS. 8 and 9C, the resistance change layer 340 changes from the HRS to the LRS in a path 3, due to the formation of the conductive filament. At this time, the threshold switching layer 320 is turned on.

Figure 9D:
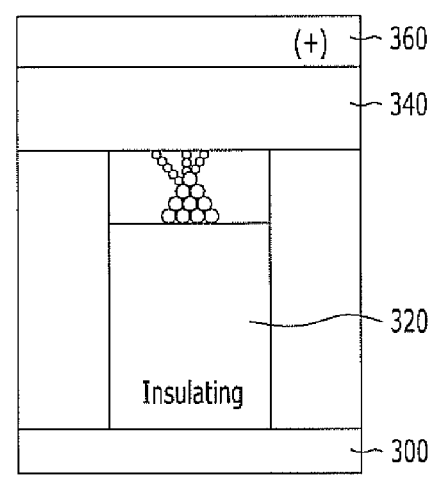

Referring to FIGS. 8 and 9D, when the voltage is reduced along the path 3 to follow a path 4, the current amount rapidly decreases. This means that the threshold switching layer 320 is turned off. That is, when the applied voltage becomes less than the sustained voltage, the threshold switching layer 320 exhibits the characteristic of a nonconductor. Furthermore, the resistance change layer 340 maintains the LRS.

Figure 9E:
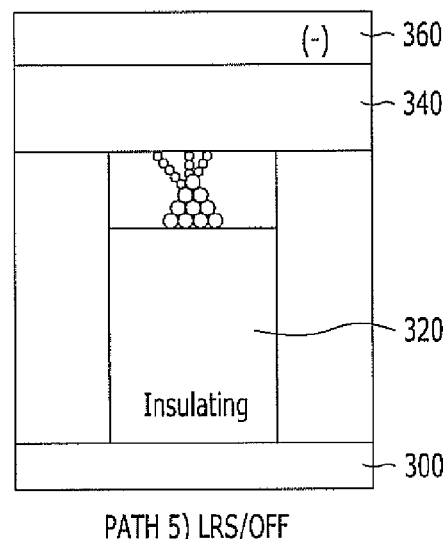

Referring to FIGS. 8 and 9E, when the voltage is applied in the negative direction in a state where the upper electrode 360 is set to a cathode and the lower electrode 300 is an anode, a path 5 is formed. In the path 5, when the magnitude of the negative voltage increases, the current rapidly increases. This means that the voltage applied to the threshold switching layer 320 exceeds the threshold voltage, and the threshold switching layer 320 is turned on. Furthermore, the resistance change layer 340 maintains the LRS. Therefore, the current is applied to the resistance change layer 340 through the turned-on threshold switching layer 320, and the motion of charges starts in the reverse direction.

Figure 9F:
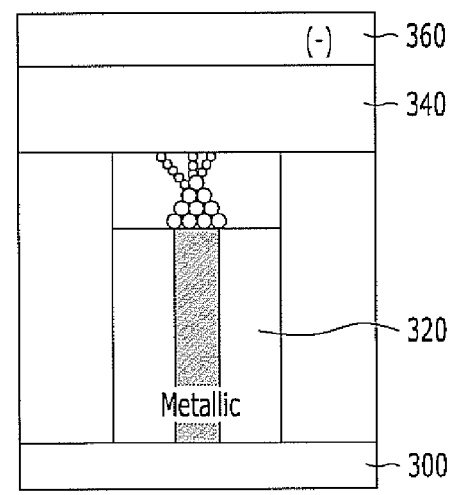

Referring to FIGS. 8 and 9F, when the voltage is continuously increased in the negative direction, a path 6 is formed. This means that the threshold switching layer 320 maintains the LRS in a state where it is turned on. However, the conductive filament of the resistance change layer 340 starts to be removed by the current flowing in the reverse direction, or oxygen ions start to be moved from the path 6 to a path 7.

Figure 9G:
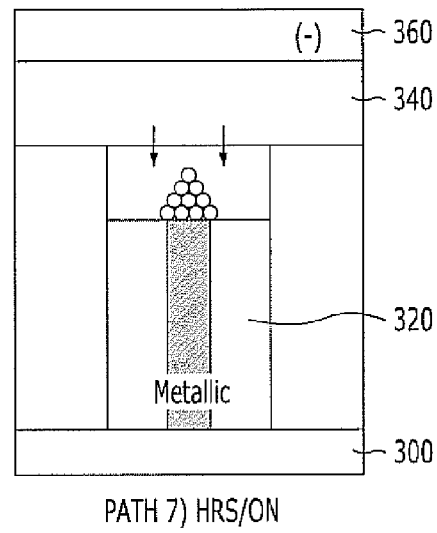

Referring to FIGS. 8 and 9G, when the voltage is further increased in the negative direction, the current amount rapidly decreases as indicated by the path 7. Therefore, the resistance change layer 340 is changed from the LRS to the HRS by the current flowing through the turned-on switching layer 320.

Figure 9H:
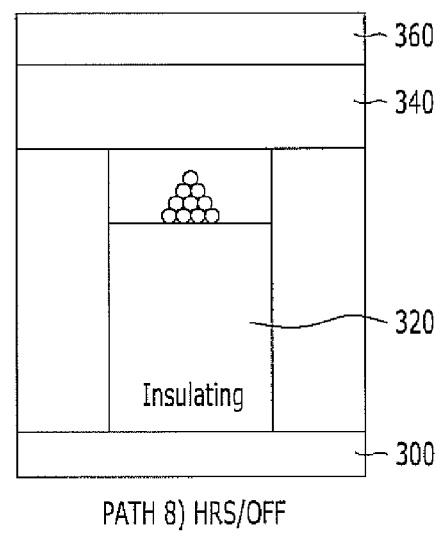

Referring to FIGS. 8 and 9H, when the resistance change layer 340 maintains the HRS and the magnitude of the negative voltage decreases, a path 8 is formed. That is, the threshold switching layer 320 transits from a conductor to a nonconductor, and is turned off. Therefore, the current is not applied to the resistance change layer 340.

Figure 10A:
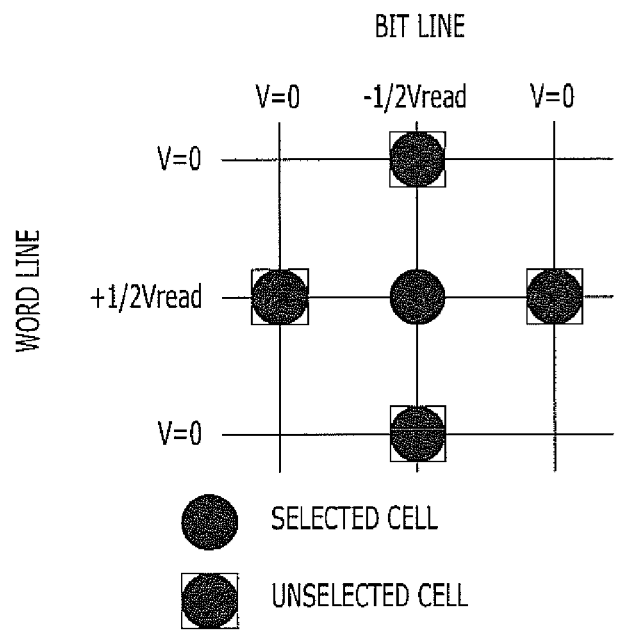
FIGS. 10A and 10B are diagram and graph for explaining the read operation characteristic of the ReRAM in accordance with the exemplary embodiment of the present invention.
Figure 10B:
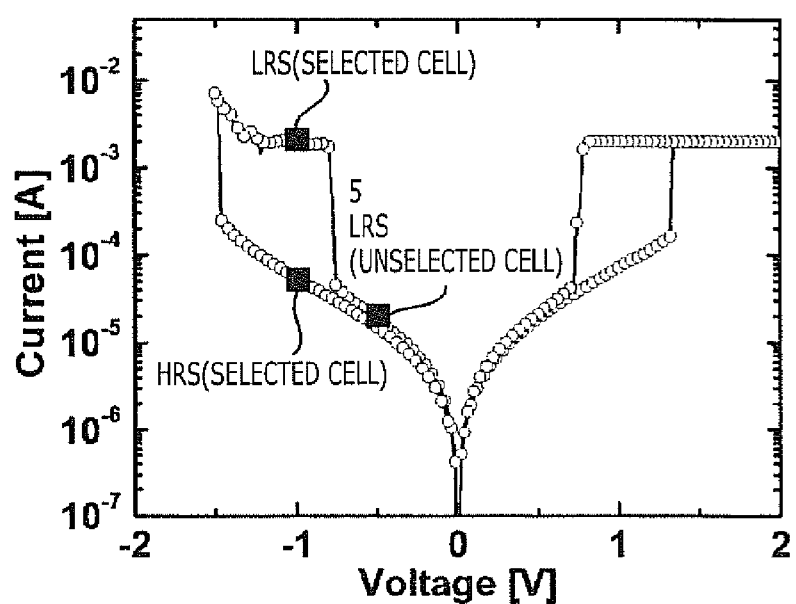

FIGS. 10A and 10B are diagrams for explaining the read operation characteristic of the ReRAM in accordance with the embodiment of the present invention.

Referring to FIGS. 10A and 10B, a bit line is set to an upper electrode, and a word line is set to a lower electrode. Furthermore, a voltage of −Vread/2 is applied to the bit line, and a voltage of Vread/2 is applied to the word line. Furthermore, Vread is set to 1V. Therefore, a read voltage of −1V is applied to a selected cell, and a read voltage of −0.5V is applied to an unselected cell adjacent to the selected cell.

According to the read voltage applied to the unselected cell, a threshold switching layer of the unselected cell has the characteristic of a nonconductor. Therefore, a current does not flow in the unselected cell. Since a current does not flow in the unselected cell although the voltage is applied, the LRS or HRS of the selected cell may be correctly sensed. Accordingly, a leakage current flowing through the unselected cell is cut off, and the precision of the read operation is improved.

In accordance with the embodiments of the present invention, the threshold switching layer and the resistance change layer are formed in the same process through the forming process. That is, oxygen is moved from the non-stoichiometric phase change layer to the upper electrode through the forming process where a non-stoichiometric material is introduced and a high voltage is applied. At the upper electrode, an oxidation reaction is caused by the supplied oxygen, and the resistance change layer is formed through the oxidation reaction. Furthermore, the phase change layer is modified into the stoichiometric threshold switching layer through the motion of oxygen. Furthermore, the phase change layer includes a transition metal oxide, and the transition metal oxide has a composition in which a proportion of oxygen therein exceeds a proportion of oxygen in the stoichiometric threshold switching layer. Therefore, the threshold switching layer and the resistance change layer may be formed at the same time by the motion of oxygen.

Therefore, the sequential stacking process is not applied, and two layers having different characteristics may be formed through one forming process in which the voltage is applied to the electrode to move oxygen ions, thereby implementing the ReRAM.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a resistive random access memory (ReRAM), comprising:
   forming a non-stoichiometric phase change layer over a first electrode;
   forming a second electrode over the phase change layer; and
   applying a voltage to the first and second electrodes, modifying the phase change layer into a threshold switching layer for a switching operation, and oxidizing a part of the second electrode to form a resistance change layer.

2. The method of claim 1, wherein the threshold switching layer comprises a stoichiometric transition metal oxide.

3. The method of claim 1, wherein the phase change layer comprises $Nb_2O_{5-x}$ (0<x<1) or $V_2O_{5-x}$ (0<x<1).

4. The method of claim 1, wherein the threshold switching layer comprises $NbO_2$, $Nb_2O_5$ or $VO_2$.

5. The method of claim 1, wherein, in the applying of the voltage to the first and second electrodes,
   a positive voltage is applied to the second electrode, and a negative voltage is applied to the first electrode.

6. The method of claim 1, wherein the modifying of the phase change layer into the threshold switching layer for a switching operation comprises moving oxygen ions of the phase change layer to the second electrode through the application of the voltage to modify the phase change layer into the stoichiometric threshold switching layer.

7. The method of claim 6, wherein the modifying of the phase change layer into the threshold switching layer for a switching operation further comprises forming a stoichiometric layer over the threshold switching layer through the motion of oxygen ions.

8. The method of claim 7, wherein the threshold switching layer comprises $NbO_2$ or $VO_2$, and the stoichiometric layer comprises $Nb_2O_5$ or $V_2O_5$.

9. The method of claim 1, wherein, in the oxidizing of a part of the second electrode to form the resistance change layer,
   the resistance change layer is formed through an oxidation reaction of the second electrode by a motion of oxygen ions.

\* \* \* \* \*